(12) United States Patent
Metzler

(10) Patent No.: US 6,433,370 B1
(45) Date of Patent: Aug. 13, 2002

(54) METHOD AND APPARATUS FOR CYLINDRICAL SEMICONDUCTOR DIODES

(75) Inventor: Richard A. Metzler, Mission Viejo, CA (US)

(73) Assignee: VRAM Technologies, LLC, Costa Mesa, CA (US)

( * ) Notice: Subject to any disclaimer, the term of this patent is extended or adjusted under 35 U.S.C. 154(b) by 0 days.

(21) Appl. No.: 09/502,026

(22) Filed: Feb. 10, 2000

(51) Int. Cl.$^7$ .......................... H01L 29/808; H01L 27/08
(52) U.S. Cl. ..................... 257/263; 257/265; 257/271; 257/594; 257/618; 257/499
(58) Field of Search ............................. 257/256, 263, 257/265, 271, 499, 594

(56) References Cited

U.S. PATENT DOCUMENTS

| | | | |
|---|---|---|---|
| 2,444,255 A | 6/1948 | Hewlett | 175/366 |
| 3,295,030 A | * 12/1966 | Allison | 257/263 |
| 3,407,343 A | 10/1968 | Fang | |
| 3,427,708 A | 2/1969 | Schutze et al. | 29/580 |
| 3,458,798 A | 7/1969 | Fang et al. | |
| 3,566,215 A | 2/1971 | Heywang | 317/235 |
| 3,586,925 A | 6/1971 | Collard | |
| 3,617,824 A | 11/1971 | Shinoda et al. | |
| 3,619,737 A | * 11/1971 | Chiu | 257/265 |
| 3,749,987 A | 7/1973 | Amantha | |
| 3,769,109 A | 10/1973 | MacRae et al. | 156/3 |
| 3,864,819 A | 2/1975 | Ying | 29/583 |
| 3,935,586 A | 1/1976 | Landheer et al. | |
| 3,943,547 A | 3/1976 | Nagano et al. | 357/38 |
| 3,988,765 A | 10/1976 | Pikor | 357/52 |
| 4,019,248 A | 4/1977 | Black | 29/583 |
| 4,045,250 A | 8/1977 | Dingwall | 148/1.5 |
| 4,099,260 A | 7/1978 | Lynes et al. | |
| 4,104,086 A | 8/1978 | Bondur et al. | 148/1.5 |

(List continued on next page.)

FOREIGN PATENT DOCUMENTS

| | | |
|---|---|---|
| DE | 3219-888 A | 5/1982 |
| DE | 19605633 A | 2/1996 |
| JP | 61156882 | 7/1986 |
| JP | 63205927 A | 8/1988 |
| JP | 63054762 | 9/1988 |
| JP | 5109883 A | 4/1993 |
| WO | WO 98/33218 | 7/1998 |

OTHER PUBLICATIONS

United States Statutory Invention Registration, Reg. No. H64, Published May 6, 1986, Full–Wave Rectifier For CMOS IC Chip, Inventor: Maleis.

Breakdown Voltage Enhancement of the p–n Junction by Self–Aligned Double Diffusion Process Through a Tapered SiO2 Implant Mask; Han–Soo Kim, Seong–Dong Kim, Min–Koo Han, Seok–Nam Yoon and Yearn–Ik Choi; Sep. 16, 1995 IEEE Electron Device Letters; pp.405–407.

Silicon Processing for the VLSI Era, vol. 1, Processing Technology; Stanley Wolf and Richard N. Tauber; 1986; pp. 321–327.

Primary Examiner—Gene M. Munson
(74) Attorney, Agent, or Firm—Blakely, Sokoloff, Taylor & Zafman LLP

(57) ABSTRACT

Semiconductor diodes are diode connected cylindrical junction field effect devices having one diode terminal as the common connection between a top gate, a back gate and a first channel terminal of the cylindrical junction field effect devices. The second diode terminal of the semiconductor diodes being the second channel terminal of the diode connected cylindrical junction field effect devices. The method of processing the cylindrical junction field effect devices provide very short channels, shallow diffused regions and trench terminated junctions at the edges of the active device for low forward voltage turn-on and high reverse bias breakdown. The trench terminated junctions spread the breakdown energy over the entire active device region rather than just device edges.

38 Claims, 8 Drawing Sheets

U.S. PATENT DOCUMENTS

| | | | |
|---|---|---|---|
| 4,138,280 A | 2/1979 | Rodov | 148/186 |
| 4,139,880 A | 2/1979 | Ulmer et al. | |
| 4,139,935 A | 2/1979 | Bertin et al. | |
| 4,140,560 A | 2/1979 | Rodov | 148/188 |
| 4,153,904 A | 5/1979 | Tasch, Jr. et al. | 357/13 |
| 4,246,502 A | 1/1981 | Kubinec | |
| 4,318,751 A | 3/1982 | Horng | 148/1.5 |
| 4,330,384 A | 5/1982 | Okudaira et al. | 204/192 |
| 4,340,900 A | 7/1982 | Goronkin | 357/56 |
| 4,372,034 A | 2/1983 | Bohr | 29/577 |
| 4,423,456 A | 12/1983 | Zaidenweber | |
| 4,533,988 A | 8/1985 | Daly et al. | |
| 4,534,826 A | 8/1985 | Goth et al. | 156/643 |
| 4,579,626 A * | 4/1986 | Wallace | 156/651 |
| 4,586,075 A * | 4/1986 | Schwenk et al. | 357/74 |
| 4,638,551 A * | 1/1987 | Einthoven | 29/571 |
| 4,666,556 A * | 5/1987 | Fulton et al. | 156/643 |
| 4,672,736 A * | 6/1987 | Westermeier | 29/569 |
| 4,672,738 A * | 6/1987 | Stengl et al. | 29/576 |
| 4,680,601 A | 7/1987 | Mitlehner et al. | |
| 4,739,378 A * | 4/1988 | Tanizawa | 257/265 |
| 4,742,377 A * | 5/1988 | Einthoven | 357/15 |
| 4,745,395 A | 5/1988 | Robinson | |
| 4,757,031 A * | 7/1988 | Kuhnert et al. | 437/154 |
| 4,774,560 A * | 9/1988 | Coe | 357/52 |
| 4,777,580 A | 10/1988 | Bingham | |
| 4,808,542 A * | 2/1989 | Reichert et al. | 437/20 |
| 4,811,065 A | 3/1989 | Cogan | |
| 4,822,601 A * | 4/1989 | Goode et al. | 424/59 |
| 4,822,757 A * | 4/1989 | Sadamori | 437/249 |
| 4,857,985 A | 8/1989 | Miller | |
| 4,875,151 A | 10/1989 | Ellsworth et al. | |
| 4,900,692 A * | 2/1990 | Robinson | 437/67 |
| 4,903,189 A | 2/1990 | Ngo et al. | |
| 4,927,772 A * | 5/1990 | Arthur et al. | 437/6 |
| 4,974,050 A * | 11/1990 | Fuchs | 357/50 |
| 5,038,266 A | 8/1991 | Callen et al. | |
| 5,047,355 A | 9/1991 | Huber et al. | |
| 5,093,693 A * | 3/1992 | Abbas et al. | 357/13 |
| 5,101,254 A | 3/1992 | Hamana | |
| 5,109,256 A | 4/1992 | De Long | |
| 5,132,749 A | 7/1992 | Nishibayashi et al. | |
| 5,144,547 A | 9/1992 | Masamoto | |
| 5,184,198 A | 2/1993 | Bartur | 257/471 |
| 5,225,376 A * | 7/1993 | Feaver et al. | 437/228 |
| 5,258,640 A | 11/1993 | Bsieh et al. | 257/471 |
| 5,268,833 A | 12/1993 | Axer | 257/471 |
| 5,296,406 A | 3/1994 | Readdie et al. | 257/281 |
| 5,349,230 A | 9/1994 | Shigekane | 257/474 |
| 5,365,102 A | 11/1994 | Mehrotra et al. | 257/475 |
| 5,396,087 A | 3/1995 | Baliga | |
| 5,426,325 A | 6/1995 | Chang et al. | 257/408 |
| 5,430,232 A | 7/1995 | Yamazaki et al. | 257/471 |
| 5,469,102 A | 11/1995 | Shou et al. | |
| 5,469,103 A | 11/1995 | Shigekane | |
| 5,475,245 A | 12/1995 | Kudo et al. | 257/288 |
| 5,475,252 A | 12/1995 | Merrill et al. | |
| 5,506,421 A | 4/1996 | Palmour | 257/77 |
| 5,510,641 A | 4/1996 | Yee et al. | 257/367 |
| 5,536,676 A | 7/1996 | Cheng et al. | 437/162 |
| 5,780,324 A | 7/1998 | Tokura et al. | |
| 5,818,084 A | 10/1998 | Williams et al. | 257/329 |
| 5,825,079 A | 10/1998 | Metzler et al. | 257/653 |
| 5,886,383 A | 3/1999 | Kinzer | |
| 5,907,181 A * | 5/1999 | Han et al. | 257/630 |
| 6,002,574 A | 12/1999 | Metzler et al. | 361/301.4 |
| 6,186,408 B1 | 2/2001 | Rodov et al. | 238/268 |

* cited by examiner

METHOD AND APPARATUS FOR CYLINDRICAL SEMICONDUCTOR DIODES

FIELD OF THE INVENTION

The present invention generally relates to the field of semiconductor devices and methods of fabricating the same. The present invention particularly relates to semiconductor diodes and their methods of fabrication.

BACKGROUND OF THE INVENTION

Semiconductor devices of various kinds are well known in the prior art. The present invention relates to methods of fabricating semiconductor diodes and the diodes so fabricated, though the methods are also directly applicable to the fabrication of transistors as well. Because of the emphasis on diodes herein, only the prior art relating thereto will be discussed.

Semiconductor diodes are widely used in electronic circuits for various purposes. The primary purpose of such semiconductor diodes is to provide conduction of current in a forward direction in response to a forward voltage bias, and to block conduction of current in the reverse direction in response to a reverse voltage bias. This rectifying function is widely used in such circuits as power supplies of various kinds as well as in many other electronic circuits.

In typical semiconductor diodes, conduction in the forward direction is limited to leakage current values until the forward voltage bias reaches a characteristic value for the particular type of semiconductor device. By way of example, silicon pn junction diodes don't conduct significantly until the forward bias voltage is at least approximately 0.7 volts. Many silicon Schottky diodes, because of the characteristics of the Schottky barrier, can begin to conduct at lower voltages, such as 0.4 volts. Germanium pn junction diodes have a forward conduction voltage drop of approximately 0.3 volts at room temperature. However, the same are currently only rarely used, not only because of their incompatibility with silicon integrated circuit fabrication, but also even as a discrete device because of temperature sensitivity and other undesirable characteristics thereof.

In some applications, diodes are used not for their rectifying characteristics, but rather to be always forward biased so as to provide their characteristic forward conduction voltage drop. For instance, in integrated circuits, diodes or diode connected transistors are frequently used to provide a forward conduction voltage drop substantially equal to the base-emitter voltage of another transistor in the circuit. While certain embodiments of the present invention may find use in circuits of this general kind, such use is not a primary objective thereof.

In circuits which utilize the true rectifying characteristics of semiconductor diodes, the forward conduction voltage drop of the diode is usually a substantial disadvantage. By way of specific example, in a DC to DC step-down converter, a transformer is typically used wherein a semiconductor switch controlled by an appropriate controller is used to periodically connect and disconnect the primary of the transformer with a DC power source. The secondary voltage is connected to a converter output, either through a diode for its rectifying characteristics, or through another semiconductor switch. The controller varies either the duty cycle or the frequency of the primary connection to the power source as required to maintain the desired output voltage. If a semiconductor switch is used to connect the secondary to the output, the operation of this second switch is also controlled by the controller.

Use of a semiconductor switch to couple the secondary to the output has the advantage of a very low forward conduction voltage drop, though has the disadvantage of requiring careful control throughout the operating temperature range of the converter to maintain the efficiency of the energy transfer from primary to secondary. The use of a semiconductor diode for this purpose has the advantage of eliminating the need for control of a secondary switch, but has the disadvantage of imposing the forward conduction voltage drop of the semiconductor diode on the secondary circuit. This has at least two very substantial disadvantages. First, the forward conduction voltage drop of the semiconductor diode device can substantially reduce the efficiency of the converter. For instance, newer integrated circuits commonly used in computer systems are designed to operate using lower power supply voltages, such as 3.3 volts, 3 volts and 2.7 volts. In the case of a 3 volt power supply, the imposition of a 0.7 volt series voltage drop means that the converter is in effect operating into a 3.7 volt load, thereby limiting the efficiency of the converter to 81%, even before other circuit losses are considered.

Second, the efficiency loss described above represents a power loss in the diode, resulting in the heating thereof. This limits the power conversion capability of an integrated circuit converter, and in many applications requires the use of a discrete diode of adequate size, increasing the overall circuit size and cost.

Another commonly used circuit for AC to DC conversion is the full wave bridge rectifier usually coupled to the secondary winding of a transformer having the primary thereof driven by the AC power source. Here two diode voltage drops are imposed on the peak DC output, making the circuit particularly inefficient using conventional diodes, and increasing the heat generation of the circuit requiring dissipation through large discrete devices, heat dissipating structures, etc. depending on the DC power to be provided.

Therefore, it would be highly advantageous to have a semiconductor diode having a low forward conduction voltage drop for use as a rectifying element in circuits wherein the diode will be subjected to both forward and reverse bias voltages from time to time. While such a diode may find many applications in discreet form, it would be further desirable for such a diode to be compatible with integrated circuit fabrication techniques so that the same could be realized in integrated circuit form as part of a much larger integrated circuit. Further, while reverse current leakage is always undesirable and normally must be made up by additional forward conduction current, thereby decreasing circuit efficiency, reverse current leakage can have other and more substantial deleterious affects on some circuits. Accordingly it would also be desirable for such a semiconductor diode to further have a low reverse bias leakage current.

In many applications it is required that the diode be put across a coil such as a transformer. In these instances it is possible for a reverse voltage to be applied to the diode which will force it into reverse breakdown, specifically into a junction avalanche condition. This is particularly true in DC to DC converters which use a rapidly changing waveform to drive transformer coils which are connected across diode bridges. In these applications a specification requirement for "Avalanche Energy" capability is a parameter normally included in the data sheets. The avalanche energy capability of a diode is a significant factor for a designer of such circuits. The avalanche energy capability determines how much design margin a designer has when designing a semiconductor diode into a circuit. The larger the number of avalanche energy capability the more design flexibility a circuit designer has.

The avalanche energy capability is a measure of the diode's capability to absorb the energy from the coil, where energy $E=(\frac{1}{2})*I^2*L$, without destroying the diode. These requirements are typically on the order of tens of millijoules. A key factor in the ability of a diode to nondestructively dissipate this energy is the amount of junction area which dissipates the energy i.e., the area of the junction which actually conducts during avalanche. Therefore, it is desirable to increase the avalanche energy capability of a semiconductor diode to improve its utilization.

In the manufacture of a semiconductor diode is desirable to reduce the die size in order to lower cost of manufacturing. Alternatively, it is desirable to increase the performance of a semiconductor diode by maintaining the same die size and manufacturing costs. In order to do so, it is desirable to form a more densely packed semiconductor diode per square area of an integrated circuit.

BRIEF SUMMARY OF THE INVENTION

The present invention includes methods and apparatus as described in the claims. Briefly, semiconductor diodes having a low forward conduction voltage drop, a low reverse leakage current, a high voltage capability and enhanced avalanche energy capability, suitable for use in integrated circuits as well as for discrete devices are disclosed. The semiconductor diodes are diode connected cylindrical junction field effect devices having one diode terminal as the common connection between a top gate, a back gate and a first channel terminal of the cylindrical junction field effect devices. The second diode terminal being the second channel terminal of the cylindrical junction field effect devices. The method of processing the diode connected cylindrical junction field effect devices provides a flat surface for improved connections and increased diode density to generate greater yield and lower device costs. The method of processing further provides short channels, shallow diffused regions and trench terminated junctions at the edges of the active device. The trench terminated junctions are formed out of a vertical etch cut through the P-N junction at the edge of the device which is then passivated with a dielectric material to provide a region of higher breakdown voltage at the edge of the device than is seen within the active device area. The trench terminated junction spreads any breakdown energy over the entire active device region rather than just device edges. Various embodiments are disclosed.

BRIEF DESCRIPTION OF THE FIGURES

Like reference numbers and designations in the drawings indicate like elements providing similar functionality.

DESCRIPTION OF THE PRESENT INVENTION

Figure 1:
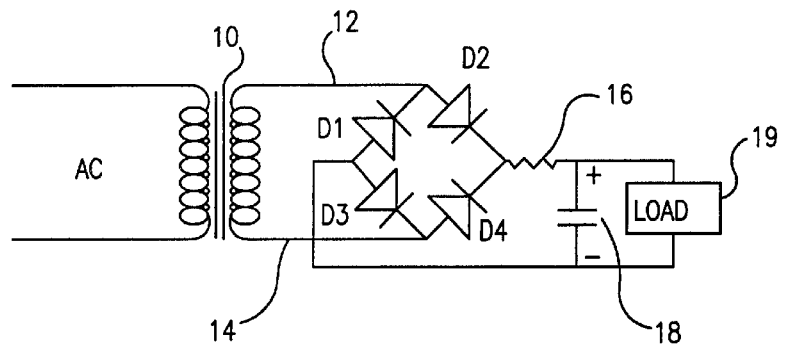
FIG. 1 is a circuit diagram for a well known AC to DC converter using a full wave bridge rectifier in which the present invention may be used.

First referring to FIG. 1, a circuit diagram for a well known AC to DC converter using a full wave bridge rectifier in which the present invention may be used may be seen. In such circuits, a transformer 10 is used to provide DC isolation between the primary and secondary circuits and frequently to provide an AC voltage step-up or step-down to the full wave bridge, comprised of diodes D1, D2, D3 and D4. When the secondary lead 12 is sufficiently positive with respect to secondary lead 14, diode D2 will conduct through resister 16 to charge or further charge capacitor 18 and to provide current to load 19, which current returns to lead 14 of the transformer through diode D3. Similarly, during the other half cycle of the AC input voltage, when the voltage on secondary lead 14 is sufficiently positive with respect to secondary lead 12, diode D4 will conduct to provide current through resistor 16 to charge capacitor 18 and to provide current to load 19, with the capacitor and load currents being returned to the secondary lead 12 through diode D1. Thus it may be seen that each time current is delivered from the full wave bridge of diodes D1 through D4 to the output of the bridge, two diode voltage drops are imposed in series with that output. Further, since any pair of diodes conduct only when the voltage across the secondary of the transformer 20 exceeds the voltage across capacitor 18 by two diode voltage drops, it is clear that current is delivered to the output of the bridge only during a fraction of the time, namely when the transformer secondary voltage is at or near a positive or negative peak.

The circuit of FIG. 1 is merely exemplary of the type of circuit in which the present invention is intended to be used. These circuits may be characterized as circuits wherein the diode will be subjected to both positive (forward) and negative (reverse) differential voltages across the two diode connections and the function of the diode is a rectifying function to provide a DC or rectified current output. This is to be distinguished from applications wherein the desired function of a diode is to provide a voltage reference responsive to the forward conduction voltage drop characteristic of the diode when conducting current, whether or not the diode will be subjected to negative differential voltages also when in use. These circuits may also be characterized as circuits wherein the diode or diodes will be subjected to both positive and negative differential voltages across the diode connections and the function of the diode or diodes is a power rectifying function to provide a DC or rectified current output of sufficient power level to power one or more circuits connected thereto. This is to be distinguished from applications wherein the desired function of the diode is to provide a signal-level current output which is used or processed in a subsequent circuit not powered by the DC or rectified current output of the diodes.

Figure 2A:
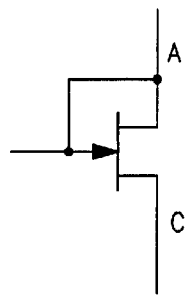
FIGS. 2A–2B are schematic diagrams of n-channel and pchannel junction field effect transistors having terminals coupled in a diode configuration.
Figure 2B:
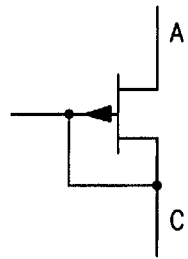
Figure 2C:
FIG. 2C is a schematic diagram of the equivalent circuit of the diode connected transistors of FIGS. 2A and 2B.

In many circuits of the type shown in FIG. 1, a linear voltage regulator may be used in the output in addition to smoothing capacitor 18. Further, resistor 16, which serves as a current limiting resistor, may be eliminated as a separate circuit component in favor of the secondary resistance of the transformer, as the transformer, in substantially all applications of interest, will be an actual discrete component of sufficient size to dissipate the power loss therein. Of particular importance to the present invention, however, are the diodes D1 through D4 themselves, as the power loss in these diodes in general serves no desired circuit function, but rather merely creates unwanted power dissipation and heat, requiring the use of larger diodes, whether in discrete form or integrated circuit form, and actually increases the size of the transformer required to provide this extra power output, e.g., the power required by the load plus the power dissipated by the diodes. The present invention is directed to the realization of diodes and/or diode functions having low diode forward conduction voltage drops, low reverse current leakage, and high voltage capabilities for use primarily in such circuits and other circuits wherein the diodes are in fact subjected to forward and reverse bias in use. This is achieved in the present invention in essence through the use of diode connected junction field effect devices, shown schematically in FIGS. 2A and 2B as n-channel and p-channel diode connected junction field effect transistors, respectively. In accordance with the preferred embodiment of the invention, such devices are fabricated through the use of common gate and drain connections, a common conducting layer on the substrate, and more preferably through one or more special fabrication techniques which enhance the electrical characteristic of the resulting device. FIG. 2C illustrates the equivalent diode of the diode connected junction field effect devices of FIGS. 2A and 2B with the respective anode "A" and cathode "C" terminals.

Figure 3:
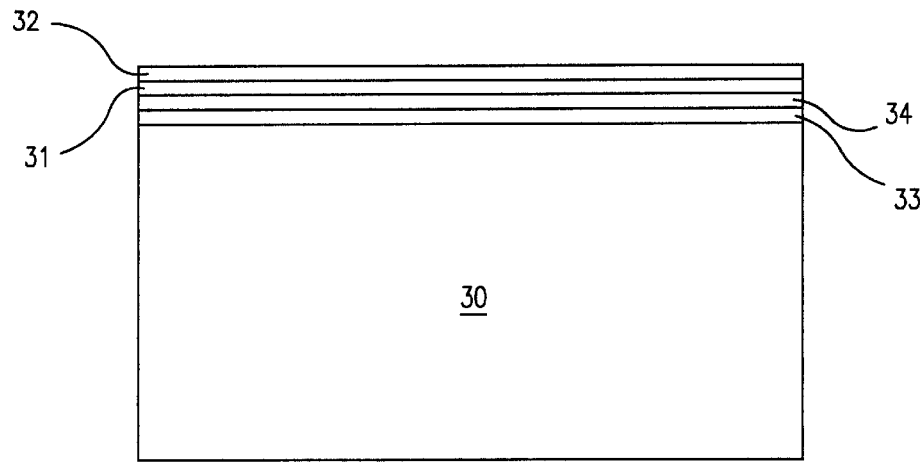
FIGS. 3, 4A, and 5–8 are cross-sectional views illustrating steps in an exemplary process for fabricating the cylindrical junction field effect semiconductor diode of the present invention.

A process for fabricating a preferred embodiment of the present invention is presented herein in relation to the cross-sectional views of FIGS. 3 through 8. The process forms a diode connected cylindrical junction field effect device. The diode connected cylindrical junction field effect device can be essentially thought of as a cylindrical junction field effect transistor being diode connected with common gate and drain connections. Even though the diode connected cylindrical junction field effect device of the present invention is sometimes referred to herein as a cylindrical junction field effect transistor, it is not a traditional junction field effect transistor (JFET). The present invention operates differently and is formed differently by a different process. FIG. 3 illustrates a silicon substrate 30 for a single diode. However, the silicon substrate 30, illustrated in FIG. 3 and in some of the subsequent figures is a chip sized substrate for multiple diodes and obviously represents nume rous such chips fabricated on a single silicon wafer, as is well known in the technology. In the specific embodiment described, the substrate is an n-type substrate but can be a p-type substrate when using alternate dopant types for implantation. Additionally, the description of a source and a drain are used for diffusions making connections to the channel of the cylindrical junction field effect device for ease of understanding. However, the definition of source and drain can swap based on voltage biasing across the diode terminals. To avoid confusion in the description herein for an n-channel cylindrical junction field effect device, assume that the diode is to be forward biased to be consistent with the description of the drain and source. In the case that the n-channel cylindrical junction field effect device is reversed biased, the source and drain terms as described herein swap.

Referring now to FIG. 3 the first stage in the process of forming the diode connected cylindrical junction field effect device (JFED) is illustrated. An initial oxide layer 31 is grown on top of the substrate 30. The oxide layer 31 is then covered with a layer of nitride 32 to provide for the formation of a self aligned cell structure. Boron is implanted into a shallow depth as a sheet implant forming a P+ type layer 34 which later forms the top gate electrode. Arsenic (As) is also implanted as a sheet implant to form an N+ type layer 33 which later forms the n-type channel of the cylindrical JFED.

Figure 4A:
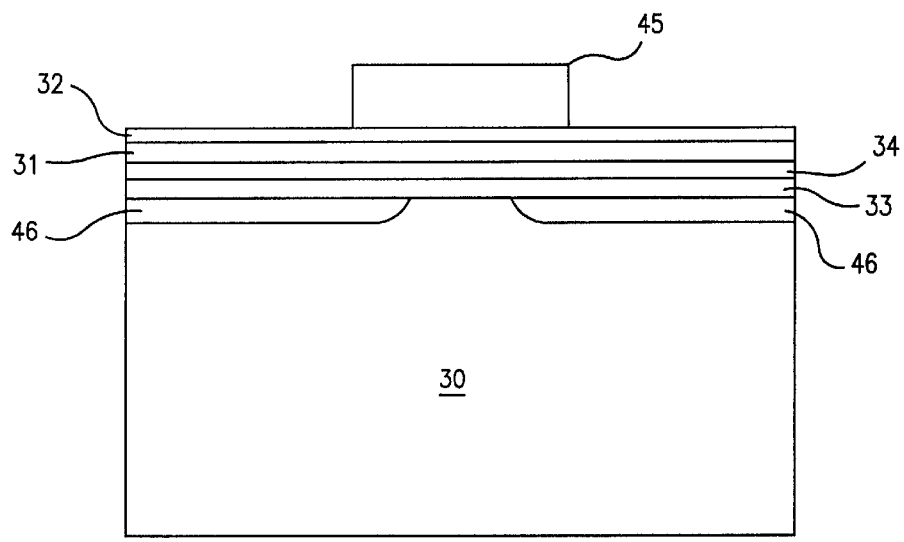
Figure 4B:
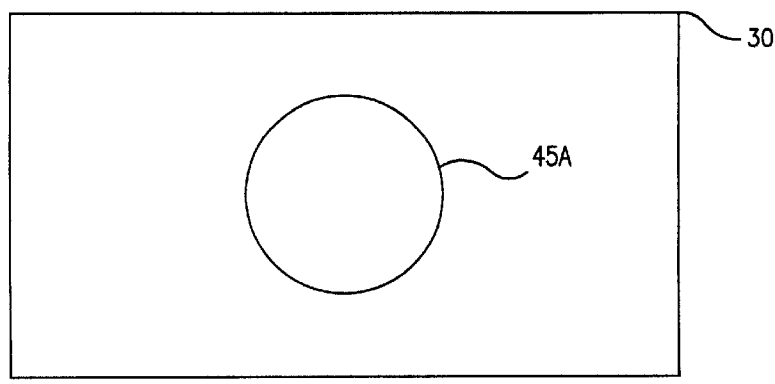
FIGS. 4B–4E are top views illustrating various exemplary shapes for the cylindrical pedestal in the exemplary process for fabricating the cylindrical junction field effect semiconductor diode of the present invention.
Figure 4C:
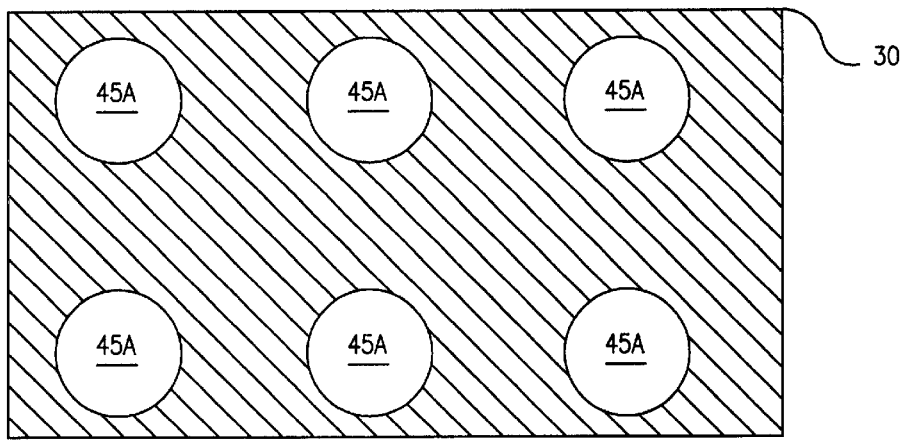
Figure 4D:
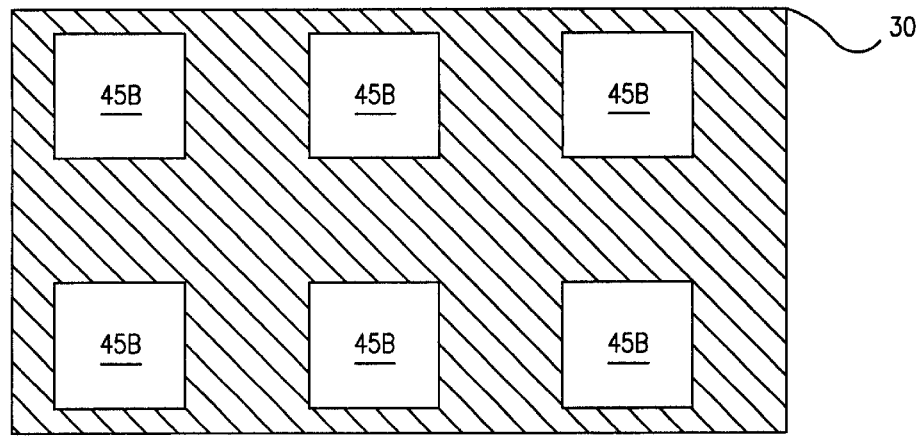
Figure 4E:
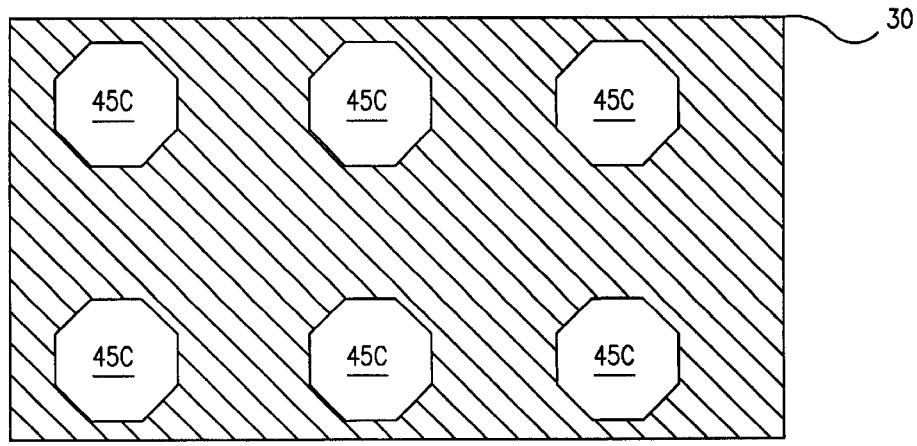

Referring now to FIG. 4A, a pedestal 45 is formed on the surface of the nitride layer 32. The pedestal 45 is temporary construction pedestal and facilitates formation of other layers and diffusion regions within the substrate 30. To form the pedestal 45, a layer of pedestal material, such as a thick oxide layer is deposited on top of the nitride layer 32. The pedestal material is typically one micron thick, although the thickness can be adjusted to compensate for subsequent processing requirements. A layer of photoresist is then deposited and patterned by photolithography using a first mask layer. The layer of pedestal material is etched using the patterned photoresist as an etch mask to form a plurality of pedestals, generally indicated by the reference numeral 45 in FIG. 4A. The pedestals 45 may be any convenient cylindrical shape, such as, by way of example, circular, hexagonal, rectangular or square. Referring now to FIG. 4B, a top view of a circular cylindrical pedestal 45A is illustrated. In that regard, in the embodiment described herein, the pedestals 45 are approximately 1 micron square and arranged in a two dimensional array, whereby a typical circuit may have on the order of 1.2 millon such pedestals. An alternate embodiment, however, may use rectangular pedestals of say approximately 1 micron wide, but having a length of many microns, so that the number of pedestals across one dimension of the circuit are far fewer (as few as one) than the number of pedestals across a second dimension of the circuit. Referring now to the top views of FIGS. 4C, 4D and 4E, for example, a plurality of circular cylindrical pedestals 45A, square cylindrical pedestals 45B, and octagonal cylindrical pedestals 45C are respectively illustrated. In any event, the pedestals 45 are formed by putting down a layer of photoresist, patterning the same, and then plasma etching, so that the pedestals will have substantially straight (vertical) sidewalls, as opposed to somewhat tapered sidewalls typically provided by wet etching.

Alternatively, the pedestals 45 described as being formed of an oxide may be fabricated of other materials, such as by way of example, depositing an oxide, nitride, oxide sandwich of layers rather than a single oxide layer. The pedestals 45 may be entirely nonconductive, or alternatively, may be formed of a conductive layer such as polysilicon. If formed of a conductive layer the pedestal should be insulated from the substrate thereunder. For instance, an equivalent pedestal structure may be fabricated by first forming one or more layers of the pedestal on the nitride layer 32 and then etching the layer or layers as described to form the substantially vertical walled pedestals, exposing the nitride layer 32 between pedestals. For the purpose of discussion, the pedestal 45 is assumed to be a solid oxide.

Referring back to FIG. 4A, after forming the pedestals 45, Boron is implanted using the pedestals as a mask through layers 31–34 to form a P+ type "Back Gate" implant layer 46 around the pedestal. The back gate implant layer 46 is implanted with such energy that it grows under the pedestal 45 slightly around its edges.

Figure 5:
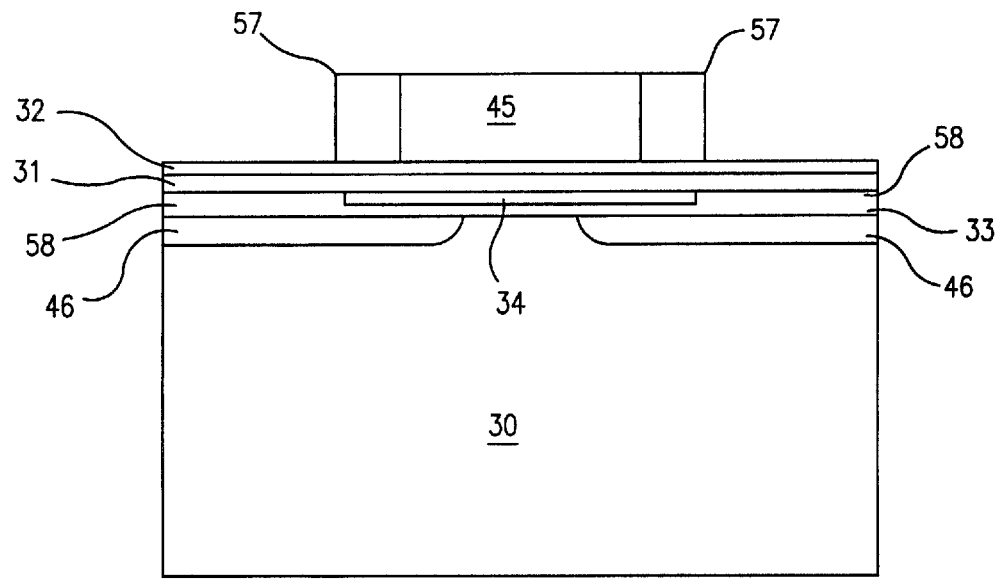

Referring now to FIG. 5, after forming the channel, the top gate, and the back gate of the cylindrical JFED, it is desirable to form the channel length to assure a low turn ON threshold of the cylindrical JFED and the diode. An offset oxide spacer ring 57 is applied to the cylindrical side wall of the cylindrical pedestal 45. This spacer ring 57 sets the channel length preferably to approximately 0.55 microns. Additionally, an N-type implantation into the surface of the substrate 30 is performed using the cylindrical pedestal 45 and the spacer ring 57 as masks. This N-type surface implantation forms the N+ contact area 58, converting the exposed P+ type layer 34 near the surface of the substrate 30 into an N-type semiconductor to merge with the N+ type layer 33.

Figure 6:
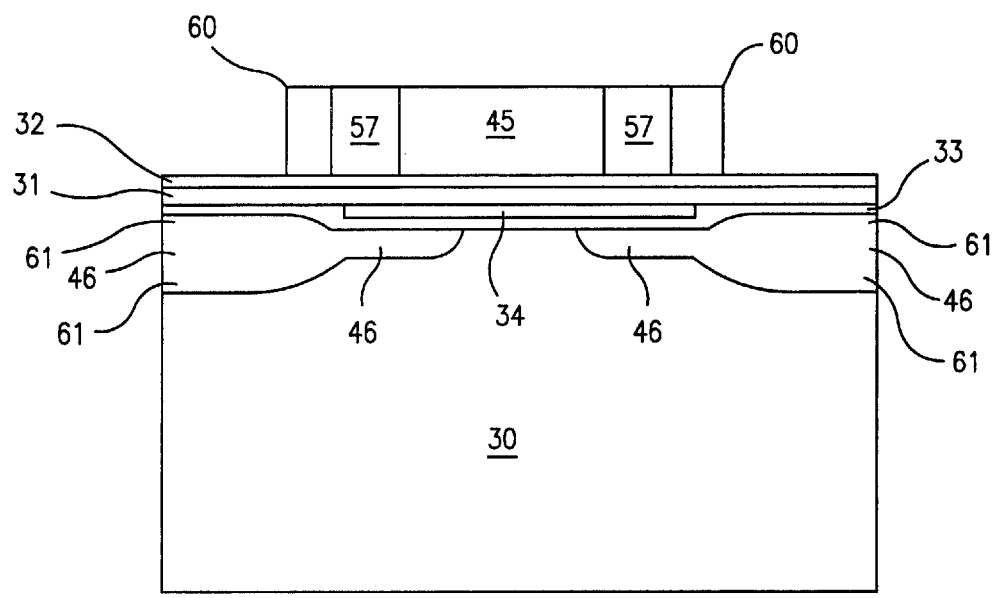

Referring now to FIG. 6, the next process steps form another cylindrical spacer ring 60 around the cylindrical spacer ring 57 and the pedestal 45. The cylindrical spacer ring 60 is used to define the width of the N+ contact area of the drain. The cylindrical spacer ring 60 additionally defines areas for a P+ contact implant in order to form P+ contact areas for the top gate and the back gate of the cylindrical JFED. The cylindrical spacer ring 60 is preferably formed of polysilicon. First the cylindrical spacer ring 60 is used in conjunction with the cylindrical spacer ring 57 and the pedestal 45 in order to mask off a cylindrical area around the pedestal from a high energy Boron implant. The high energy Boron implant is implanted into areas outside the cylindrical spacer ring 60 in order to increase the breakdown voltage and breakdown capability of the cylindrical JFED. The high energy Boron implant is driven deep into the substrate 30 forming a p-type region 61 merging with the P+ type "Back Gate" implant layer 46. Because the implantation is so deep, the surface area above the p-type region 61 remains N-type such that a surface implantation is necessary to make contact to it.

Figure 7:
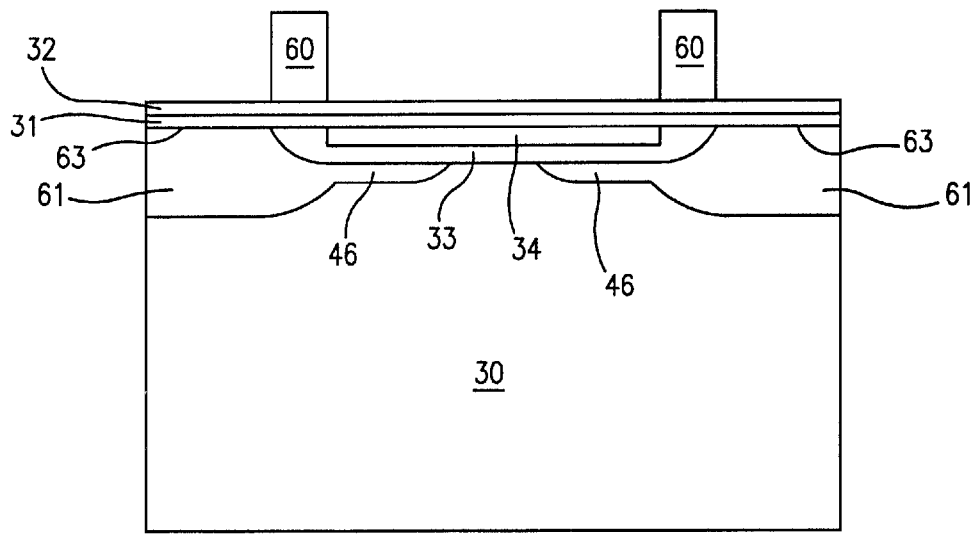

Referring now to FIG. 7, in the next process steps the pedestal 45 and the cylindrical spacer ring 57 are removed to expose areas for surface implantation to provide ohmic contacts for the back gate and the top gate of the cylindrical JFED. The cylindrical spacer ring 60 remains to mask out the N+ contact area for the drain of the JFED. A surface implantation of Boron into the exposed portions of the N type channel implant layer 33 causes the silicon in this region to change to P+ type and merge with the P-type region 61. This forms a contact region in the P-type region 61 which has merged with layer 46 which acts as the back gate of the JFED. The Boron surface implantation into the P+ type layer 34 provides an ohmic contact region therein which acts as the top gate of the JFED. A surface implantation is used at this step to protect the n-type cylindrical channel ring formed in layer 33 and sandwiched between the top gate layer 34 and the back gate layer 46.

Figure 8:
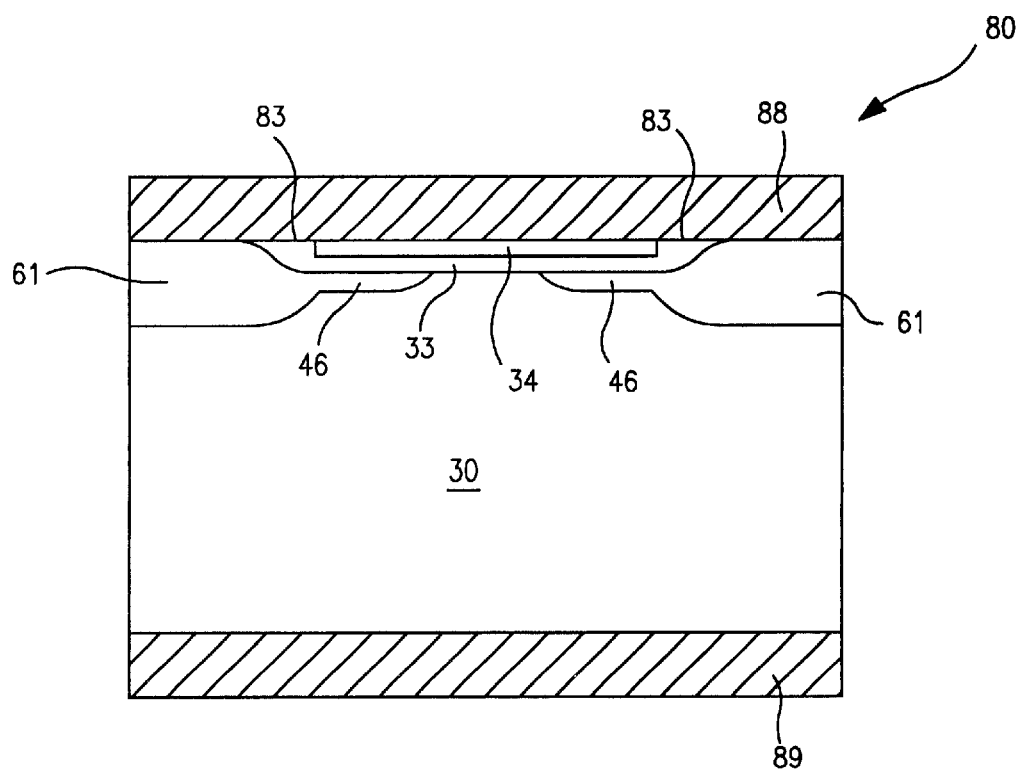

Referring now to FIG. 8, the next steps in forming the cylindrical JFED 80 are to remove the cylindrical spacer ring 60 in order to provide a flat surface with no pedestals or spacer rings. Next, the nitride layer 32 is stripped away from the nitride layer 32 of the surface of the cylindrical JFED 80. Next, the oxide layer 31 is striped from the surface of the cylindrical JFED. This allows a conductive layer 88 to be deposited across the surface to make contact with the ohmic contacts in the silicon. The conductive layer 88 couples to the top gate layer 34 (p-type layer), a drain region 83 in layer 33, and the p-type diffusion 61 which is connected to the back gate 46. Thus the conductive layer 88 essentially shorts the top gate, the drain, and the back gate of the cylindrical JFED 80 together. The substrate 30 acts as the source of the cylindrical JFED 80 connecting to the channel formed by layer 33.

Next in the process of completing the diode co nnected cylindrical JFED 80 is to provide a conductive contact to the source. A backgrind of backside of the substrate 30 across the wafer is performed grinding off on the order of two mils (one-thousandth of an inch) of substrate material. Then a conduct ive layer 89 is deposited to the b ackside of the substrate 30 thereby making ohmic contact to the source of the cylindrical JFED 80. This completes formation of the cylindrical JFED 80 as a diode.

As a result of the JFED being cylindrical, a number of its regions or components have various cylindrical type of shapes. Referring to FIG. 8, n-type layer 33 and the top gate layer 34 are cylindrical in shape. The channel formed in layer 33 between the top gate 34 and back gate 46 has a cylindrical shape with the channel length being the difference of radius between outer and inner cylinders. The drain contact region 83 and the back gate contact region 63 are shaped as cylindrical rings. The back gate layer 46 has a cylindrical opening near the center of the cylindrical JFED diode 80.

Figure 9A:
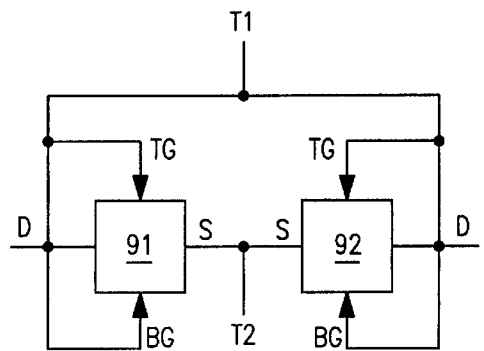
FIGS. 9A–9B illustrates schematic equivalent circuits for a two dimensional model of the cylindrical junction field effect semiconductor diode.

The process steps in FIGS. 3–8 are described for an n-type subst rate 30 with appropriate P-type and N-type implantation forming diffusion regions in the substrate. In this case, FIG. 9A illustrates the equivalent circuit of the two dimensional cross section of the cylindrical JFED semiconductor diode 80. The cyl indrical JFED diode 80 operates by controlling the channel conduction through the depletion of the Arsenic channel layer by means of the top gate and the back gate electrodes.

Figure 9B:
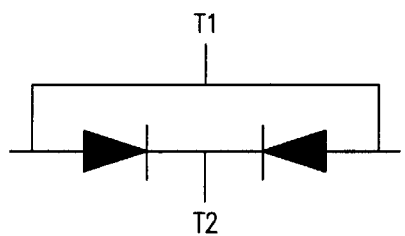
Figure 9C:
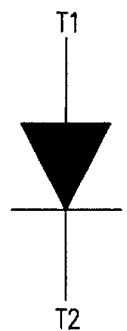
FIG. 9C illustrates a schematic equivalent circuit for a three dimensional model of the cylindrical junction field effect semiconductor diode.

In FIG. 9A, the schematic representation of junction field effect transistors (JFETS) 91 and 92 represents the cross section of one diode connected cylindrical junction field effect device (JFED). The drain D, the top gate TG, the bottom gate BG are coupled together in each of transistors 91 and 92 to the first terminal T1, the anode of the semiconductor diode. The sources S of each of the transistors 91 and 92 are coupled together to the second terminal T2, the cathode of the semiconductor diode. FIG. 9B illustrates the diode equivalent of the transistors 91 and 92 of FIG. 9A where two diodes are connected in parallel together. FIG. 9C illustrates the electrical equivalent, a single diode, of the three dimensional diode connected cylindrical junction field effect device of the present invention.

With respect to the current capability of a diode, the maximum forward current is a function of its width. The shape of the JFED is cylindrical providing a cylindrical width. Because of its process simplicity and the fact that the diode connected cylindrical JFED is cylindrical in shape width, the width of the diode per unit of diode area is maximized. Thus, the diode connected cylindrical JFED is more efficient in providing a given current density per unit of area of device and is therefore less expensive to manufacture.

With respect to the threshold voltage, by appropriately selecting the dopants, their concentrations, and other materials and dimensions for fabrication of the cylindrical JFED diode, the channel regions may be made to be just conduct at substantially zero forward bias across the anode and cathode. Thus, in rectifying applications such as in power supplies and the like, the present invention can provide reduced power consumption and heating in rectifying devices, and greater overall efficiency of the resulting circuits.

With respect to the reverse bias breakdown voltage of the cylindrical JFED diode, a reverse bias voltage appears between the diffusions 61 and 46 forming the back gate of the JFED and the substrate 30 causing a depletion region to form deep in the substrate. As a result of the diffusion regions 61 and 46 and the diode connection of the cylindrical JFED diode, high reverse bias voltages are kept in the diffusion regions and the substrate layers such that the top gate region 34 of the cylindrical JFED diode does not see a high reverse bias voltage. The electric field lines of the reverse bias voltage are additionally substantially planar around the cylindrical JFED diode due to the longitudinal shape and grading of the diffusion regions 61 and 46 further increasing the breakdown of the cylindrical JFED diode. The cylindrical region of the substrate 30 between the cylindrical diffusion regions 61 and 46 totally depletes forming a rather smooth continuous depletion edge below the diffusion regions 61 and 46.

Figure 10A:
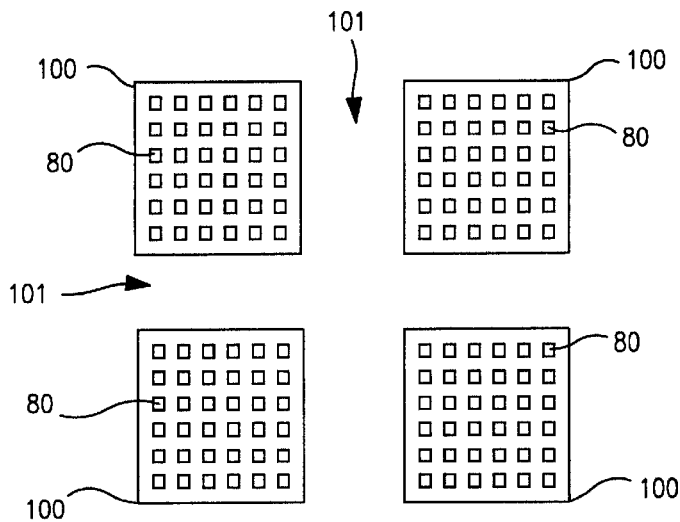
FIG. 10A illustrates active diode areas on a wafer employing a plurality of cylindrical junction field effect semiconductor diodes.
Figure 10B:
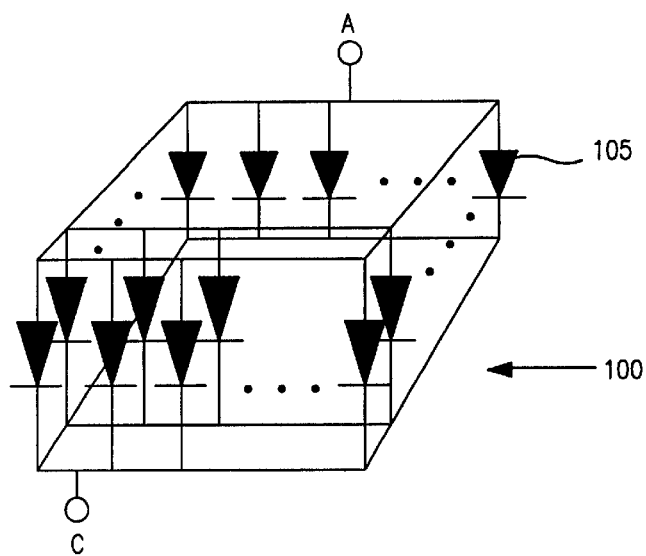
FIG. 10B is a schematic diagram of the electrical equivalent of one active diode area.

The next steps in the process of forming the diode further increase the reverse bias breakdown voltage capability and form the high current capability for the diode structure by arranging for it to be formed out of multiple cylindrical JFED diodes connected in parallel together and providing device termination. The process begins with the deposition of a masking layer, such as an oxide layer, over the entire wafer. The oxide layer is then masked with photoresist and patterned. Referring now to FIG. 10A, the pattern of photoresist leaves a continuous pad of oxide over a plurality of diode active areas 100 and exposes oxide to define scribe channels 101 between the diode active areas 100 on the wafer. In each diode active area 100 are a plurality of cylindrical JFED diodes 80. FIG. 10B illustrates the schematic equivalent of a diode active area 100 having multiple diodes 105, each representing a cylindrical JFED diode 80, connected in parallel together. Adding the widths of each of these cylindrical JFED diodes 80 connected in parallel together results in large current carrying capability. It is understood that there are several hundred diode active areas 100 on a wafer, with only four being shown in FIG. 10A. Each individual diode active area 100 contains thousands of individual cylindrical JFED diodes 80.

Figure 11:
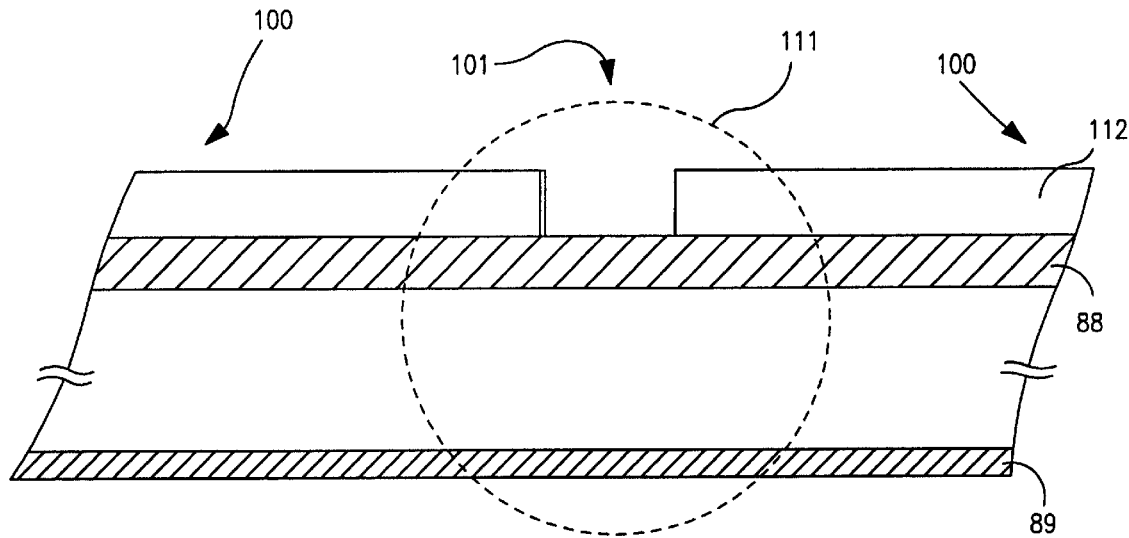
FIG. 11 is a cross-sectional view of the first steps in the formation of trenches in the preferred embodiment of the present invention.
Figure 12A:
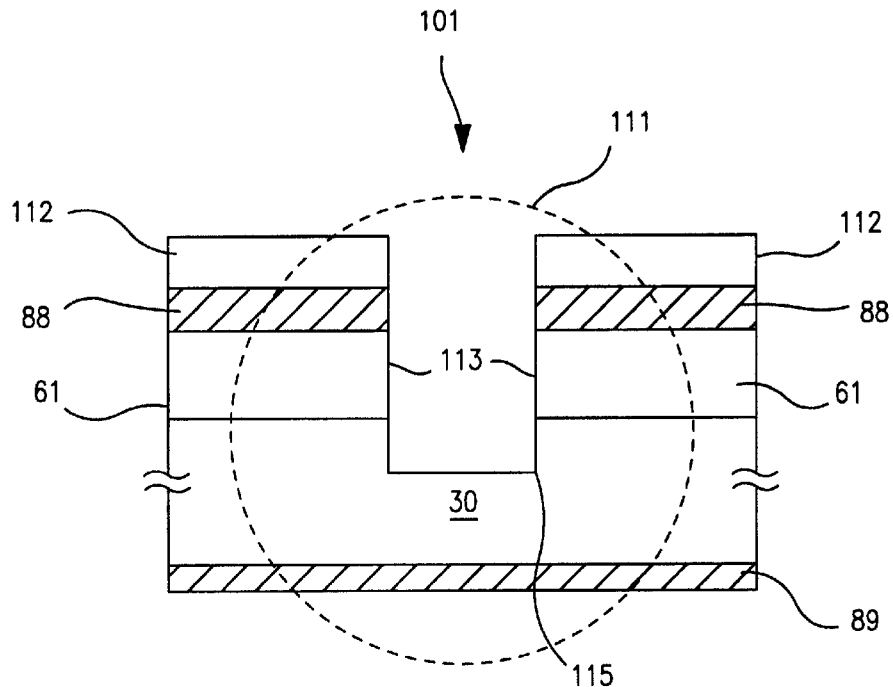
FIGS. 12A–12B are magnified cross-sectional views illustrating the final steps in the formation of the trenches in the preferred embodiment of the present invention.
Figure 12B:
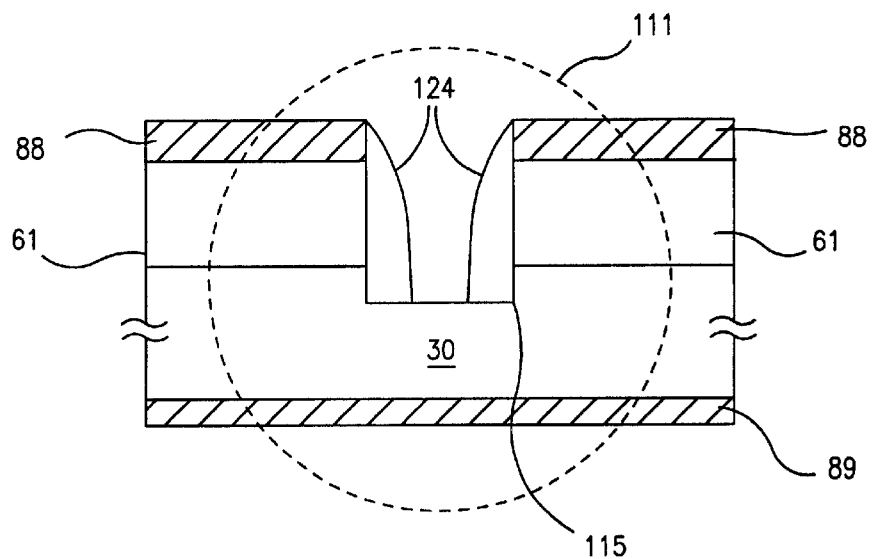

To increase the reverse bias breakdown voltage, it is desirable to keep the electric field lines of the depletion region straight and parallel with little crowding at pn junctions and a minimal amount of curvature near electric field termination points. One such electric field termination point is at the device termination for the diode active areas 100. In order to increase the reverse bias breakdown voltage, trench isolation is used to provide a uniform electric field at the device termination. Referring now to FIGS. 11 and 12A–12B, the formation of a trench in the scribe channel 101 between diode active areas 100 is illustrated.

After forming the pattern of photoresist defining the diode active areas 100 and the scribe channels 101, the oxide layer 112 is then etched to expose the underlying metal layer 88 in the scribe channels 101. FIG. 11 illustrates the oxide layer 112 etched away at scribe channel 101 exposing the underlying metal layer 88. Next, the exposed metal of the metal layer 88 is subsequently etched exposing the underlying silicon surface in the scribe channels 101. The subsequent metal etch of metal layer 88 may be done by using either wet or dry etch techniques. A vertical silicon etch is then used to cut a trench 115 in the underlying silicon in the scribe channels 101 between each of the diode active areas 100. FIG. 12A illustrates the completion of the silicon etch forming the trench 115. The etch forms two vertical trench walls and a bottom of the trench. The width of the trench may be narrow or wide on the order between eight-tenths of a micron to a couple of mils. A narrow trench provides closely spaced devices with similar voltage breakdown levels while a wide trench relaxes the etching step requirements to facilitate ease of manufacturing.

During the silicon etch process the oxide layer 112 protects the metal surfaces from being etched. Trenches 115 have substantially vertical sidewalls 113 as shown if FIG. 12A. The depth of the trench 115 varies depending upon the required operating voltage of the resulting diode. The trench depth is sufficient to extend through the diffusion region 61 and into the silicon substrate 30 to a depth which will exceed the expected depletion width during reverse diode bias.

In the prior art device breakdown is reduced because of the type of device or transistor termination used in the diffusion region. The electric field lines tends to reduce their spacing in the prior art in the termination area leading to premature or lower avalanche breakdown voltages. To increase the avalanche breakdown voltage the trench 115 is used to terminate the diffusion region 61 between active diode areas 100 to provide trench terminated junctions. With the trench walls formed perpendicular to the diffusion region 61, the electric field lines are kept substantially straight and parallel to one another up to the trench wall thereby increasing the breakdown voltage. As previously discussed, the trench depth is important to assure higher reverse bias diode breakdown. Upon application of a reverse bias, a depletion region results and the trench depth should be selected to keep the depletion region from going beyond the depth of the trench and underneath the bottom to join the diode active area 100 that may be located next to it.

The next step in the process is to isotropically deposit a dielectric over the wafer so that the walls of the trenches are coated with three-tenths of a micron of a dielectric material such as oxide. The thickness of the dielectric material is varied depending upon the desired voltage capability of the diode structures. Next, a vertical etch is used to remove the dielectric and masking oxide from the horizontal surfaces of the diode devices to expose the metalization 88 and leaving the sidewall dielectric 124 in the trench as shown in FIG. 12B. With the termination trenches 115 now completed, diodes may be formed from one or more of the active diode areas 100 and packaged together having separate terminals for individual connection such as in a chip package or they may be packaged having joined terminals to increase the current density of the diode device. In order to separate along the scribe lines 101 a saw is used to dice the desired number of active diode areas 100 for a packaged diode. The termination provided by the trench 115 illustrated in FIG. 12B is sufficient to cause the actual breakdown to occur beneath the cylindrical JFED diode at the edge of the back gate layer 46 in FIG. 8. This provides a very large area for the distribution of the breakdown energy over the thousands of cylindrical JFED diodes in each diode active area 100 of a diode device.

One advantage to the diode connected cylindrical JFED is that less area is used to form the cylindrical JFED and thus a higher density of diodes may be formed in a given wafer. Another advantage to the diode connected cylindrical JFED is that it is a self aligned structure such that few masks need be used and there are no critical mask alignment requirements with respect to the fabrication techniques used herein.

In certain instances in the foregoing description, certain alternate materials and methods were set forth. It is evident that modification to the sequences of depositions, etches and implants can be made to produce the same final device but using a different process sequence. It is to be noted however, that the identification of specific alternative materials and processes is not to infer that still other materials and processes for those or other steps in the process of fabrication or in the resulting diode devices are excluded from use in the present invention. To the contrary, steps and materials other than those set out herein will be obvious to those skilled in the art. Thus while the present invention has been disclosed and described with respect to certain preferred embodiments, it will be understood to those skilled in the art that the present invention diodes and methods of fabricating the same may be varied without departing from the spirit and scope of the invention.

What is claimed is:

1. A diode having a first terminal and a second terminal, the diode comprising:
   a cylindrical junction field effect device (JFED) having a top gate, a back gate, and a first channel terminal coupled together and to the first terminal of the diode; and
   the cylindrical JFED having a second channel terminal coupled to the second terminal of the diode.

2. The diode of claim 1 further comprising:
   a plurality of cylindrical JFEDs coupled in parallel to the cylindrical JFED, the plurality of cylindrical JFEDs having top gates, back gates, and first channel terminals coupled together and coupled to the first terminal of the diode; and
   the plurality of cylindrical JFEDs having second channel terminals coupled to the second terminal of the diode.

3. The diode of claim 1, wherein,
   the cylindrical junction field effect device is an n-channel cylindrical junction field effect device and the first terminal is an anode of the diode and the second terminal is a cathode of the diode.

4. The diode of claim 3, wherein,
   in the case that the diode is forward biased with the anode being more positive than the cathode, the first channel terminal is a drain and the second channel terminal is a source, and
   in the case that the diode is reverse biased with the cathode being more positive than the anode, the first channel terminal is a source and the second channel terminal is a drain.

5. The diode of claim 1, wherein,
   the cylindrical junction field effect device is a p-channel cylindrical junction field effect device and the first terminal of the diode is a cathode of the diode and the second terminal of the diode is an anode of the diode.

6. The diode of claim 5, wherein,
   in the case that the diode is forward biased with the anode being more positive than the cathode, the first channel terminal is a drain and the second channel terminal is a source, and
   in the case that the diode is reverse biased with the cathode being more positive than the anode, the first channel terminal is a source and the second channel terminal is a drain.

7. The diode of claim 1 wherein
   the channel of the cylindrical JFED is a cylindrical ring sandwiched between the top gate and the back gate, a center axis of the cylindrical ring of the channel aligned with a center axis of the cylindrical JFED.

8. The diode of claim 1 wherein
   the second channel terminal of the cylindrical JFED is cylindrical at a bottom surface of the channel in a substrate and central to the cylindrical JFED.

9. The diode of claim 1 wherein
   the first channel terminal of the cylindrical JFED is a cylindrical ring at a top surface of the channel in a substrate, the center axis of the cylindrical ring aligned with the center axis of the cylindrical JFED.

10. The diode of claim 1 wherein the first terminal is a conductive layer coupling the top gate, the back gate, and the first channel terminal of the cylindrical JFED together.

11. A semiconductor diode having a first terminal and a second terminal, the semiconductor diode comprising:
    a semiconductor substrate of a first conductivity type having top and bottom surfaces;
    back gate diffusion layer in the substrate having a cylindrical edge and forming a cylindrical region of substrate around a center axis;
    a channel diffusion layer in the substrate, the channel diffusion layer being bowl shaped and having a top and a bottom surface and an edge at the top surface of the substrate, the bottom surface of the channel diffusion layer on a top surface of the back gate diffusion layer and capping the cylindrical region of substrate around the center axis, the channel diffusion layer coupling to the cylindrical region of the substrate near the central region of its bottom surface to form a first channel terminal region for a channel, the edge of the channel diffusion layer at the top surface of the substrate forming a second channel terminal region for the channel; and
    a top gate diffusion layer in the semiconductor substrate, the top gate diffusion layer cylindrically shaped and centered around the center axis, the top gate diffusion layer having a bottom surface coupled to the top surface of the channel diffusion layer.

12. The semiconductor diode of claim 11, further comprising:
    a first conductive layer coupled to the back gate diffusion layer at a top surface, the channel diffusion layer at the edge at the top surface, and the top gate diffusion layer at a top surface, and forming the first terminal.

13. The semiconductor diode of claim 12, further comprising:
    a second conductive layer coupled to the bottom of the substrate and forming the second terminal.

14. The semiconductor diode of claim 13, wherein,
    the back gate diffusion layer, the channel diffusion layer, and the top gate diffusion layer form a back gate, a first channel terminal, and a top gate respectively of a cylindrical n-channel junction field effect device and the first conductive layer coupling the back gate, the first channel terminal, and the top gate together into an anode of the diode and the substrate forming a second channel terminal of the cylindrical n-channel junction field effect device to which the second conductive layer is coupled as the cathode of the diode.

15. The semiconductor diode of claim 13, wherein, the back gate diffusion layer, the channel diffusion layer, and the top gate diffusion layer form a back gate, a first channel terminal, and a top gate respectively of a cylindrical p-channel junction field effect device and the first conductive layer coupling the back gate, the first channel terminal, and the top gate together into an anode of the diode and the substrate forming a second channel terminal of the cylindrical p-channel junction field effect device to which the second conductive layer is coupled as the cathode of the diode.

16. A diode device providing a one way electrical valve between an anode terminal and a cathode terminal, the diode device comprising:

one or more diode active regions having anodes coupled in parallel together for the anode terminal and cathodes coupled in parallel together for the cathode terminal, each diode active region including, a plurality of cylindrical diode structures each having a cylindrical ring shaped channel, a cylindrical ring shaped first channel terminal, a cylindrical ring shaped back gate, a cylindrical shaped top gate, and a cylindrical shaped second channel terminal, each being centered around a central axis, and, a dielectric coated silicon trench wall surrounding each diode active region and substantially perpendicular to planes of diffusion regions of the plurality of cylindrical diode structures near the trench wall, the trench wall for causing electric field lines to be substantially parallel and terminate substantially perpendicular to the trench wall.

17. The diode device of claim 16, wherein,
the trench wall extends beyond the planes of diffusion regions of the plurality of cylindrical diode structures to increase a reverse diode breakdown voltage.

18. The diode device of claim 16, wherein,
there are more than one diode active regions each spaced apart from one another and having the trench well spaced apart from another active regions trench wall.

19. The diode device of claim 18, wherein,
the trench walls are substantially spaced apart for ease of manufacture of the trench walls.

20. The diode device of claim 18, wherein,
the trench walls are minimally spaced apart to increase circuit density.

21. A diode having a first terminal and a second terminal, the diode comprising:

a plurality of cylindrical junction field effect devices each having a top gate, a back gate, and a first channel terminal coupled together and to the first terminal of the diode; and each of the plurality of cylindrical junction field effect devices having a second channel terminal coupled to the second terminal of the diode.

22. The diode of claim 21, wherein,
the plurality of cylindrical junction field effect devices are n-channel cylindrical junction field effect devices and the first terminal is an anode of the diode and the second terminal is a cathode of the diode.

23. The diode of claim 22, wherein,
in the case that the diode is forward biased with the anode being more positive than the cathode, the first channel terminal is a drain and the second channel terminal is a source of each of the plurality of cylindrical junction field effect devices.

24. The diode of claim 22, wherein,
in the case that the diode is reverse biased with the cathode being more positive than the anode, the first channel terminal is a source and the second channel terminal is a drain.

25. The diode of claim 21, wherein,
the plurality of cylindrical junction field effect devices are p-channel cylindrical junction field effect devices and the first terminal of the diode is a cathode of the diode and the second terminal of the diode is an anode of the diode.

26. The diode of claim 25, wherein,
in the case that the diode is forward biased with the anode being more positive than the cathode, the first channel terminal is a drain and the second channel terminal is a source.

27. The diode of claim 25, wherein,
in the case that the diode is reverse biased with the cathode being more positive than the anode, the first channel terminal is a source and the second channel terminal is a drain.

28. The diode of claim 21 wherein
each channel of the plurality of cylindrical junction field effect devices is a cylindrical ring sandwiched between the top gate and the back gate, a center axis of the cylindrical ring of the channel aligned with a center axis of the respective cylindrical junction field effect device.

29. The diode of claim 21 wherein
the second channel terminal of each of the plurality of cylindrical junction field effect devices is cylindrical at a bottom surface of a channel in a substrate and central to the respective cylindrical junction field effect device.

30. The diode of claim 21 wherein
the first channel terminal of each of the plurality of cylindrical junction field effect devices is a cylindrical ring at a top surface of a channel in a substrate, the center axis of the cylindrical ring aligned with the center axis of the respective cylindrical junction field effect device.

31. The diode of claim 21 wherein
the first terminal is a conductive layer coupling together each top gate, each back gate, and each first channel terminal of the plurality of cylindrical junction field effect devices.

32. A diode having a first terminal and a second terminal, the diode comprising:

a top gate;
a back gate;
a first channel terminal;
the top gate, the back gate and the first channel terminal coupled together and to the first terminal of the diode;
a second channel terminal coupled to the second terminal of the diode; and
a channel sandwiched between the top gate and the back gate.

33. The diode of claim 32 wherein
the channel is a diffusion layer in a semiconductor substrate having a cylindrical ring shape.

34. The diode of claim 32 wherein
the channel is a diffusion layer a semiconductor substrate having a bowl shape.

35. The diode of claim 32 wherein
the back gate is a diffusion layer in a semiconductor substrate having a cylindrical edge and forming a cylindrical region of substrate around a center axis of the diode.

36. The diode of claim 32 wherein
the top gate is a diffusion layer in a semiconductor substrate cylindrically shaped and centered around a center axis of the diode.

37. The diode of claim 32 wherein
the channel is a diffusion layer in a semiconductor substrate having a cylindrical ring shape;
the back gate is a diffusion layer in the semiconductor substrate having a cylindrical edge and forming a cylindrical region of the semiconductor substrate around a center axis of the diode; and the top gate is a diffusion layer in the semiconductor substrate cylindrically shaped and centered around the center axis of the diode.

38. The diode of claim 32 wherein the channel is a diffusion layer in a semiconductor substrate having a bowl shape;

the back gate is a diffusion layer in the semiconductor substrate having a cylindrical edge and forming a cylindrical region of the semiconductor substrate around a center axis of the diode; and the top gate is a diffusion layer in the semiconductor substrate cylindrically shaped and centered around the center axis of the diode.

* * * * *